US010326464B2

(12) United States Patent
Rogi et al.

(10) Patent No.: US 10,326,464 B2
(45) Date of Patent: Jun. 18, 2019

(54) SELF-OSCILLATING MULTI-RAMP CONVERTER AND METHOD FOR CONVERTING A CAPACITANCE INTO A DIGITAL SIGNAL

(71) Applicant: Infineon Technologies Austria AG, Villach (AT)

(72) Inventors: Christopher Rogi, Klagenfurt (AT); Richard Gaggl, Poertschach am Woerthersee (AT); Enrique Prefasi, Madrid (ES)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

(21) Appl. No.: 15/981,475

(22) Filed: May 16, 2018

(65) Prior Publication Data

US 2018/0337684 A1    Nov. 22, 2018

(30) Foreign Application Priority Data

May 19, 2017   (DE) .......................... 10 2017 110 976

(51) Int. Cl.
*H03M 1/12*  (2006.01)
*H03M 1/06*  (2006.01)
(Continued)

(52) U.S. Cl.
CPC ............ *H03M 1/069* (2013.01); *H03M 1/52* (2013.01); *H03M 1/56* (2013.01); *H03M 1/10* (2013.01);
(Continued)

(58) Field of Classification Search
CPC .. H03M 1/10; H03M 1/12; H03M 2201/2355; H03M 1/1019; H03M 1/804
(Continued)

(56) References Cited

U.S. PATENT DOCUMENTS

2016/0265995 A1* 9/2016 Wang ...................... H03M 3/39

OTHER PUBLICATIONS

George, B. et al., "Analysis of the Switched-Capacitor Dual-Slope Capacitance-to-Digital Converter," Transactions on Instrumentation and Measurement, IEEE, vol. 59, No. 5, May 2010, pp. 997-1006, ISSN 1557-9662.

(Continued)

*Primary Examiner* — Joseph J Lauture
(74) *Attorney, Agent, or Firm* — Slater Matsil, LLP

(57) ABSTRACT

According to various embodiments, a multi-slope converter can have the following: an integrator circuit having a charge store; a clocked comparator; a sensor circuit having a capacitor arrangement and a charging circuit for pre-charging the capacitor arrangement, a discharging circuit; a switch arrangement and a controller circuit for actuating the switch arrangement based on a clock signal; wherein the controller circuit is set up to actuate the switch arrangement such that, alternately: in an integration cycle electrical charge is transferred from the capacitor arrangement of the sensor circuit to the charge store of the integrator circuit, and in a deintegration cycle the charge store of the integrator circuit is discharged by means of the discharging circuit, wherein after the integration cycle a residual charge remains stored in the charge store of the integrator circuit and is taken into consideration during a subsequent integration cycle.

16 Claims, 9 Drawing Sheets

(51) Int. Cl.
  *H03M 1/52* (2006.01)
  *H03M 1/56* (2006.01)
  *H03M 1/46* (2006.01)
  *H03M 1/80* (2006.01)
  *H03M 1/10* (2006.01)

(52) U.S. Cl.
  CPC ............ *H03M 1/1019* (2013.01); *H03M 1/12* (2013.01); *H03M 1/466* (2013.01); *H03M 1/804* (2013.01); *H03M 2201/2355* (2013.01)

(58) Field of Classification Search
  USPC .................... 341/172, 121, 120, 128, 155
  See application file for complete search history.

(56) References Cited

OTHER PUBLICATIONS

Sanjurjo, J. P, et al., "An Energy-Efficient 17-bit Noise-Shaping Dual-Slope Capacitance-to-Digital Converter for MEMS Sensors," ESSCIRC Conference 2016, 42nd European Solid-State Circuits, Sep. 12-15, 2016, pp. 389-392,—ISBN 978-1-5090-2972-3.

\* cited by examiner

SELF-OSCILLATING MULTI-RAMP CONVERTER AND METHOD FOR CONVERTING A CAPACITANCE INTO A DIGITAL SIGNAL

This application claims the benefit of German Application No. 102017110976.5, filed on May 19, 2017, which application is hereby incorporated herein by reference in its entirety.

TECHNICAL FIELD

Various exemplary embodiments relate to a self-oscillating multi-slope converter and a method for converting a capacitance into a digital signal.

BACKGROUND

In general, various sensors, e.g. ambient sensors, may be integrated in or into electronic devices, for example to measure physical and/or chemical properties such as pressure, temperature, gas composition or the like. What are known as MEMS (microelectromechanical systems) are used as sensor elements on account of their comparatively high sensitivity for low power consumption. However, these sensor elements need to be able to be read in a suitable manner in order to provide a measurement result for further processing. For this reason, a dedicated ASIC (application specific integrated circuit, also called a custom chip), for example, can be coupled to the sensor, for example to measure a capacitance of the MEMS. Nowadays, it is customary, for example, to provide the measurement result by means of a digital variable, such systems being referred to as CDCs (capacitance-to-digital converters), for example.

SUMMARY

According to various embodiments, a multi-slope converter is provided. The multi-slope converter may be configured as a dual-slope or quad-slope converter, for example.

According to various embodiments, a multi-slope converter can have the following, for example: an integrator circuit having a charge store; a clocked comparator; a sensor circuit having at least one capacitor arrangement and a charging circuit 106c for pre-charging the at least one capacitor arrangement, a discharging circuit; a switch arrangement and a controller circuit for actuating the switch arrangement based on a clock signal; wherein the controller circuit is set up to actuate the switch arrangement such that, alternately: in an integration cycle electrical charge is transferred from the at least one capacitor arrangement of the sensor circuit to the charge store of the integrator circuit, and in a deintegration cycle the charge store of the integrator circuit is discharged by means of the discharging circuit, wherein after the deintegration cycle a residual charge remains stored in the charge store of the integrator circuit and is taken into consideration during a subsequent integration cycle.

According to various embodiments, a method for converting a capacitance into a digital signal can involve the following: in a first time period, pre-charging a capacitor arrangement of a sensor circuit and transferring a charge from the pre-charged capacitor arrangement to a charge store of an integrator circuit; and in a second time period, alternately with the first time period, discharging the charge store of the integrator circuit by means of a discharging circuit and generating a digital output signal by means of a clocked comparator based on an output signal of the integrator circuit; wherein the first time period has a predefined first number of clock cycles and wherein the second time period has a predefined second number of clock cycles, wherein after the discharging of the charge store of the integrator circuit in the second time period a residual charge remains stored in the charge store of the integrator circuit and is taken into consideration during subsequent transferring of the charge from the pre-charged capacitor arrangement to the charge store of the integrator circuit in the first time period.

According to various embodiments, a self-oscillating multi-slope converter can be used for directly reading a capacitance of a capacitor of a sensor arrangement by means of capacitor switch control.

BRIEF DESCRIPTION OF THE DRAWINGS

Exemplary embodiments are depicted in the figures and are explained in more detail below.

DETAILED DESCRIPTION OF ILLUSTRATIVE EMBODIMENTS

Figure 1A:
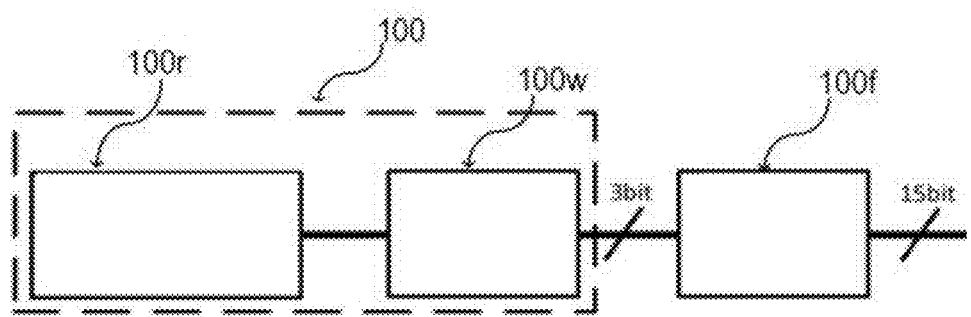
FIG. 1A shows a multi-slope converter in a schematic depiction, according to various embodiments.

In the detailed description that follows, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since components of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various exemplary embodiments described herein can be combined with one another, unless specifically indicated otherwise. Therefore, the detailed description that follows should not be interpreted in a restrictive sense, and the scope of protection of the present invention is defined by the appended claims.

Within the context of this description, the terms "connected" and "coupled" are used to describe both a direct and an indirect connection and a direct or indirect coupling. In the figures, identical or similar elements are provided with identical reference signs, insofar as this is expedient.

Various embodiments are described herein that relate to a reading circuit having an integrated sensor element. For illustrative purposes, according to various embodiments, a capacitance-to-digital converter is provided that, by way of example, can be realized on as small a chip area as possible and consumes as little power as possible.

According to various embodiments, a capacitance-to-digital converter is provided that has as small a number of components as possible and nevertheless provides the desired functions. This can be used to manufacture an inexpensive unit, for example, that provides a moderate measurement resolution at comparatively low measurement frequency, i.e. over a long measurement time, (e.g. 20 Hz or lower).

According to various embodiments, the capacitance-to-digital converter described herein is set up such that capacitive reading can be affected without a preamplifier and that the AD (analog-to-digital) conversion is based on a multi-slope architecture. By way of example, a design based on a dual slope converter, a quad-slope converter or a converter having a different number of slopes can be used.

Conventional high end ASICs also support high measurement resolutions, for example, but require a large chip area to that end. ASICs having lower measurement resolutions may be relevant if the size of the unit needs to be reduced.

Further, there is an increasing number of different narrowband capacitive ambient sensors that all require an ASIC in order to perform a measurement. Hence, it may be useful to be able to provide an ASIC by means of which different sensors can be read without the entire ASIC needing to be altered. For illustrative purposes, a reading circuit is provided herein that can be changed over to different modes of operation in a simple manner, so that firstly the reading circuit can be used to operate a sensor in different modes of operation and secondly different sensors can be operated by means of the same reading circuit.

In the literature, various topologies have been proposed for capacitance-to-digital conversion. Capacitance-to-digital conversion can also be referred to generally as analog-to-digital conversion (AD conversion or ADC). Many of the topologies require a specific interface stage for reading a MEMS, i.e. in order to convert the capacitive value of a sensor element into an electrical variable (e.g. into an electrical voltage), for example. This specific interface stage may be a preamplifier, for example. The analog voltage value generated can then be converted using different AD converter topologies, for example by means of a conventional multi-stage delta signal converter. This approach can result in a few disadvantages, e.g. a specific input stage is needed in order to connect the MEMS and the ADC (analog-to-digital converter) to one another as appropriate. If flexibility in regard to power/resolution and multi-mode MEMS support is important, it is necessary for the filter order and/or coefficients and clock frequencies (using the sampling ratio) to be changed in the case of a delta-sigma converter in order to provide different modes of operation.

In order to increase the flexibility for multimode support, it is possible for a different ADC approach to be used, for example. A robust choice for a simple ADC topology may be the integrating dual-slope ADC, in which the amplitude resolution interacts with the temporal resolution. Again, this conventionally involves the use of a separate input stage (e.g. a preamplifier) for connecting the sensor in order to generate an electrical signal based on the sensor variable, this requiring additional power and an additional chip area. A conventional implementation of a dual-slope ADC may be inadequate, however, if the power is important.

To read an MEMS sensor without an additional input stage, it is possible, according to various embodiments, for a circuit-controlled capacitor circuit to be used. The principle is referred to as what is known as a "switched capacitor read out". With this approach, high resolution capacitance-to-digital conversion (CDC) can be affected, based on the principle of charge transfer between measurement capacitors, in order to convert the sampled capacitance into a voltage (or another electrical variable).

As depicted in a schematic view in FIG. 1A, for example, it is possible, according to various embodiments, for a multi-slope converter 100 (also referred to as a CDC circuit) to be configured such that a sensor structure (e.g. an MEMS structure) is read by means of a switched capacitor read out 100r and the voltage provided thereby is converted directly by means of a continuous or clocked multi-slope (e.g. dual-slope) AD conversion 100w. Therefore, moderate measurement resolutions can be achieved with low chip area consumption and low power consumption.

In contrast to a conventional ADC, it is possible, according to various embodiments, for a self-oscillating multi-slope converter to be used, thus improving performance with simultaneously lower demands on the components, for example. In this case, it is possible for multiple modes of operation to be supported (multi-mode support). Further, power scaling can be supported by means of adaptation of only a single-circuit component of the ADC circuit. This minimizes the complexity when adapting the ADC circuit to suit different types of sensor structures.

As illustrated in FIG. 1A, the multi-slope converter 100 may, in comparison with conventional approaches, be designed such that there is no need to use a preamplifier in order to convert the capacitance of the sensor arrangement into a voltage before the conversion 100w by means of the ADC circuit. For illustrative purposes, the reading 100r and the conversion 100w are realized by means of a common circuit arrangement 100.

The multi-slope converter 100 may be of less complex design than conventional reading systems on account of the direct conversion of the capacitance that is read, since fewer components are involved, for example.

The direct reading of an MEMS sensor by means of a switched capacitor circuit is based on charge redistribution, which allows a small number of components to be used for providing the signal chain. The advantageous properties of the multi-slope conversion are, by way of example, simple design, robustness and balancing out of the amplitude in relation to the measurement resolution. By means of this design, it may be sufficient to use only one amplifier unit that implements both functions.

For illustrative purposes, the MEMS structure represents the input stage of the multi-slope converter, thus saving a stage in the signal chain. Further, first order noise shaping is made possible at the same time by virtue of a self-oscillating modification of the integrator of the multi-slope converter being used to store the quantization error after every conversion, as described in more detail below. Therefore, it is possible for the measurement resolution of the multi-slope converter 100 to be increased or else adapted, for example. Further, an amplifier offset and low-frequency noise rejection using an auto-zero approach can be implemented, e.g. by means of sampling and subtracting offset and low-frequency noise components from the integrator output, thus simplifying the balance requirements of the amplifier (matching) and reducing the area requirement of the amplifier.

Programming of only one circuit component can be used to achieve both power scaling and MEMS compatibility. Further, a moderate-to-high resolution multi-bit ADC output can be achieved using only a single-bit circuit.

An implementation is provided herein that is flexible to use, requires less power and chip area and delivers a moderate-to-high measurement resolution, e.g. with the focus on ambient sensors measuring at low-frequency. In this case, it is possible for different capacitive MEMS sensors to be incorporated in optimum fashion by means of only one implementation, for example.

As illustrated in FIG. 1A, the multi-slope converter 100 may have had or can have the digital output thereof connected to a filter 100f, e.g. to a decimation filter.

Figure 1B:
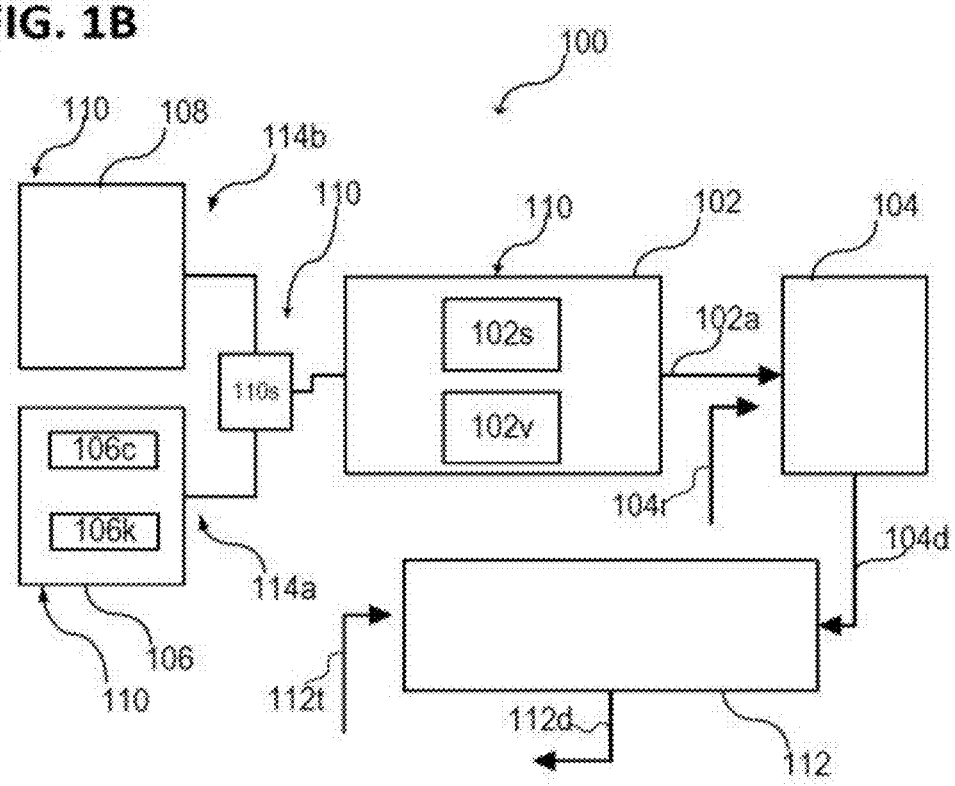
FIG. 1B shows a multi-slope converter in a schematic depiction, according to various embodiments.

FIG. 1B illustrates a multi-slope converter 100 in a schematic depiction, according to various embodiments. In this case, the multi-slope converter 100 can have an integrator circuit 102. The integrator circuit 102 can have a charge store 102s, e.g. a capacitive charge store having one or more capacitors. Further, the integrator circuit 102 can have an amplifier 102v, e.g. an operational amplifier or another suitable amplifier.

Further, the multi-slope converter 100 can have a clocked comparator 104. The comparator 104 can convert the output signal 102a (also referred to as analog voltage signal 102a or $V_{INT}$) of the integrator circuit 102 into a digital (e.g. 1-bit) signal 104d (also referred to as digital comparator output signal or $V_{COMP}$, for example based on a comparison. The comparator 104 is operated based on a clock signal 112t (Clk), for example, which may have been or can be provided in any suitable manner. To compare the output signal 102a of the integrator circuit 102, a comparator reference signal 104r is provided, e.g. a reference potential (e.g. a ground potential, or a positive or negative reference potential) may have been or can be provided as comparator reference signal 104r. According to the various embodiments, the comparator 104 may be set up such that an arithmetic sign (the polarity) of the analog voltage signal 102a output by the integrator circuit 102 can be ascertained.

Further, the multi-slope converter 100 can have a sensor circuit 106. The sensor circuit 106 may have been or can be connected to the integrator circuit 102. The sensor circuit 106 has, by way of example, a capacitor arrangement 106k (e.g. a capacitor measurement bridge or an MEMS bridge) and also a charging circuit 106c for pre-charging the capacitor arrangement 106k. To pre-charge the capacitor arrangement 106k, it is possible for one or more switches to be used that are set up such that the capacitor arrangement 106k can be read by means of switching of the respective switches, i.e. for illustrative purposes the sensor circuit 106 is set up to allow what is known as switched capacitor read out. The respective switches of the sensor circuit 106 or the respective switches for controlling the sensor circuit 106 may be part of a switch arrangement 110 of the multi-slope converter 100.

Further, the multi-slope converter 100 can have a discharging circuit 108. The discharging circuit 108 may have been or can be connected to the integrator circuit 102. The discharging circuit 108 can have one or more switches to allow controlled discharge. The respective switches of the discharging circuit 108 or the respective switches for controlling the discharging circuit 108 may be part of a switch arrangement 110 of the multi-slope converter 100.

According to various embodiments, the multi-slope converter 100 can have a switch arrangement 110 and also a controller circuit 112 for actuating the switch arrangement 110. In this case, the actuation of the switch arrangement 110 can be effected based on a clock signal 112t (Clk). This clock signal 112t can also be used for clocking the comparator 104. The clock signal 112t can be generated by means of the controller circuit 112 or supplied to the controller circuit 112 externally.

According to various embodiments, the controller circuit 112 may be set up to actuate the switch arrangement 110 such that, alternately: in an integration cycle (also referred to as phase I herein) electrical charge is transferred from the capacitor arrangement 106k of the sensor circuit 106 to the charge store 102s of the integrator circuit 102, and in a deintegration cycle (also referred to as phase II herein) the charge store 102s of the integrator circuit 102 is discharged by means of the discharging circuit 108. In this case, the multi-slope converter 100 may be set up in self-oscillating fashion, wherein after the deintegration cycle a residual charge (also referred to as error charge or quantization error) remains stored in the charge store 102s of the integrator circuit 102 and is taken into consideration during a subsequent integration cycle.

As illustrated in FIG. 1B, the sensor circuit 106 and the discharging circuit 108 can each be connected to the integrator circuit 102 and disconnected from the integrator circuit 102 by means of at least one switch 110s of the switch arrangement 110. Therefore, the sensor circuit 106 may have been or can be connected directly to the integrator circuit 102 in the integration cycle, and the discharging circuit 108 may have been or can be connected directly to the integrator circuit 102 in the deintegration cycle. In this case, the switch 110s may be an "OR" switch, so that only either the sensor circuit 106 or the discharging circuit can be connected directly to the integrator circuit 102.

Therefore, the amplifier 102v of the integrator circuit 102 may have been or can be connected between the discharging circuit 108 and the clocked comparator 104 in the deintegration cycle, e.g. by means of at least one switch 110s of the switch arrangement 110. Further, the amplifier 102v of the integrator circuit 102 may have been or can be connected between the sensor circuit 106 or the capacitor arrangement 106k of the sensor circuit 106 and the clocked comparator 104 in the integration cycle, e.g. by means of at least one switch 110s of the switch arrangement 110. For illustrative purposes, only precisely one amplifier 102v may be necessary, which is used both for the integration cycle and for the deintegration cycle based on the control by means of the switch arrangement 110.

As illustrated in FIG. 1B, the sensor circuit 106 or the capacitor arrangement 106k of the sensor circuit 106 can be connected to the integrator circuit 102 by means of a first branch 114a to transfer a charge from the pre-charged capacitor arrangement 106k to the charge store 102s of the integrator circuit. Further, the discharging circuit 108 can be connected to the integrator circuit 102 by means of a second branch 114b to discharge the charge store 102s of the integrator circuit 102. In this case, the switch arrangement 110 has at least one switch 110s that connects either the first branch 114a or the second branch 114b to the integrator circuit 102.

Figure 5A:
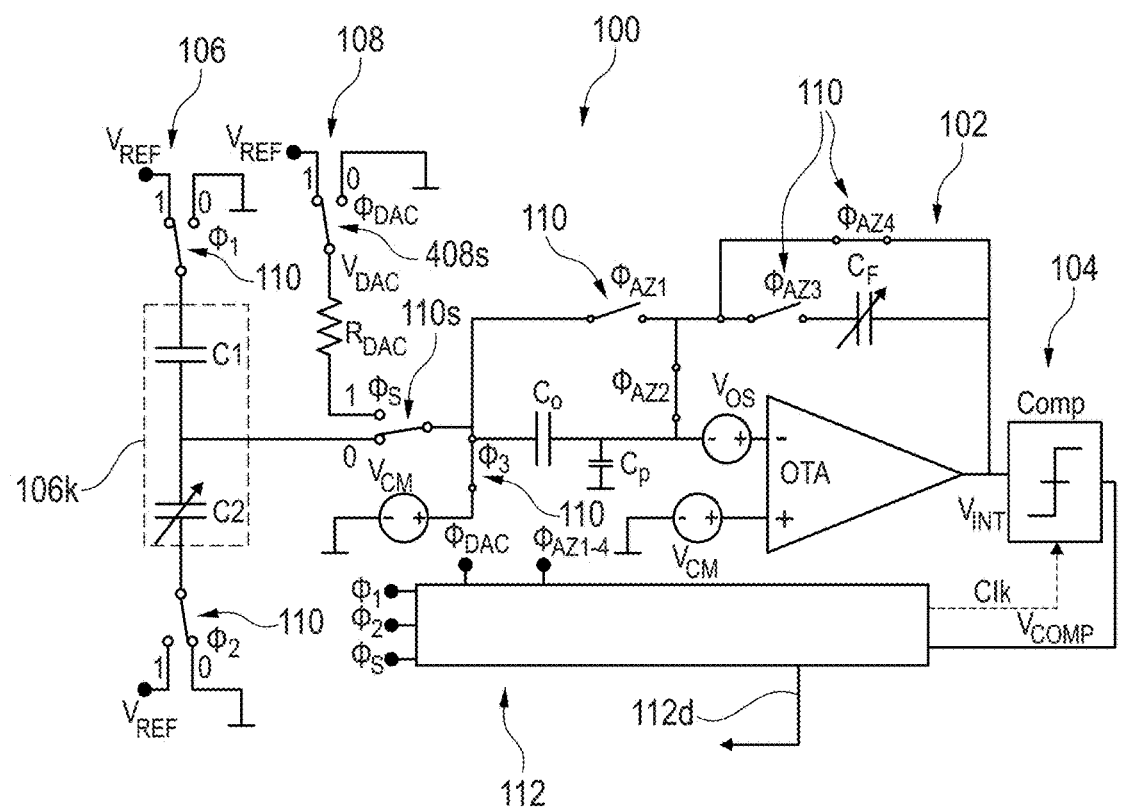
FIG. 5A shows a multi-slope converter in a schematic depiction, according to various embodiments.
Figure 6A:
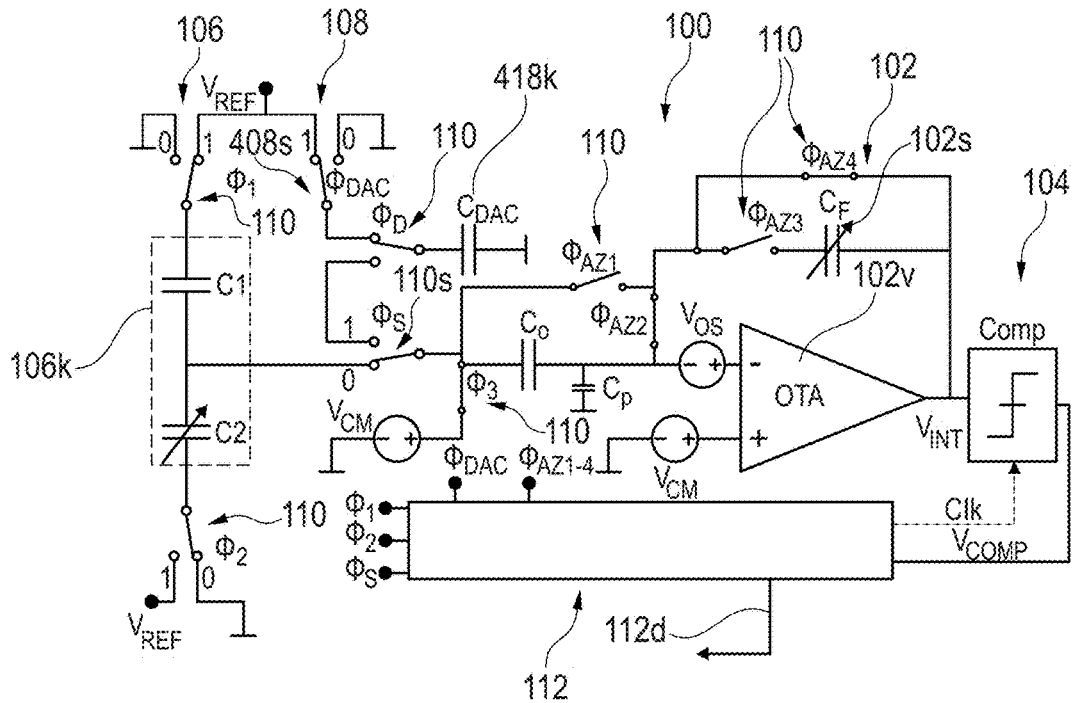
FIGS. 6A to 6D show a multi-slope converter at various times during operation, according to various embodiments.

According to various embodiments, the controller circuit 112 is set up to output a digital output signal 112d (also referred to as $D_{OUT}$), for example. This is generated based on the digital comparator output signal 104d ($V_{COMP}$), for example, the digital output signal 112d of the controller circuit 112 representing a capacitance (e.g. absolutely, $C_2$, or a capacitance difference $C_1$-$C_2$, as illustrated in FIG. 5A and FIG. 6A, for example) of the capacitor arrangement 106K.

The controller circuit 112 has, by way of example, appropriate logic circuits or a processor, memory or a state machine (or finite state machine), etc., so that, by way of example, the controller circuit 112 can be used to actuate the switch arrangement 110 as appropriate, for example see FIG. 5A to FIG. 5C and FIG. 6A to FIG. 6D, and that the digital comparator output signal 104d can be summed and accordingly a digital output signal 112d can be provided that represents a measurement capacitance of the capacitor arrangement 106k.

The text below describes various optional configurations and details regarding the operation of the multi-slope converter 100 that relate to what is described above.

Figure 2:
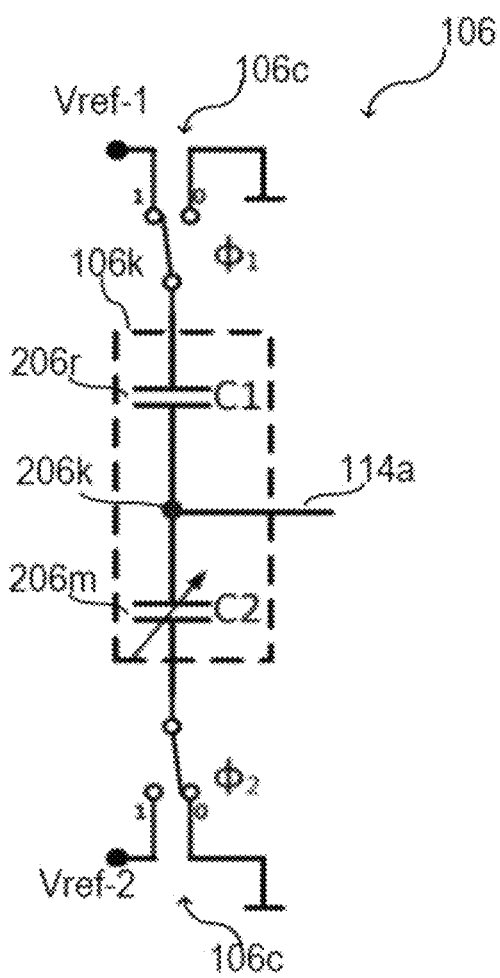
FIG. 2 shows a sensor circuit of a multi-slope converter in a schematic depiction, according to various embodiments.

FIG. 2 illustrates, by way of example, a sensor circuit 106 in the schematic circuit diagram, according to various embodiments. The sensor circuit 106 can have, by way of example, a measurement capacitor 206m that, by way of example, is used to measure a pressure or the like. Optionally, the sensor circuit 106 can have a reference capacitor 206r, so that the sensor circuit 106 can be used to measure the change of capacitance in the measurement capacitor 206m relative to the reference capacitor 206r. In this case, the sensor circuit 106 can be connected to the integrator circuit 102 by means of the node 206k situated between the measurement capacitor 206m and the reference capacitor 206r. For illustrative purposes, the sensor circuit 106 can have a capacitor measurement bridge, wherein the node 206k situated between the measurement capacitor 206m and the reference capacitor 206r of the capacitor measurement bridge provides a bridge output. The measurement capacitor 206m and the reference capacitor 206r, for illustrative purposes, form a capacitive voltage divider.

Figure 5B:
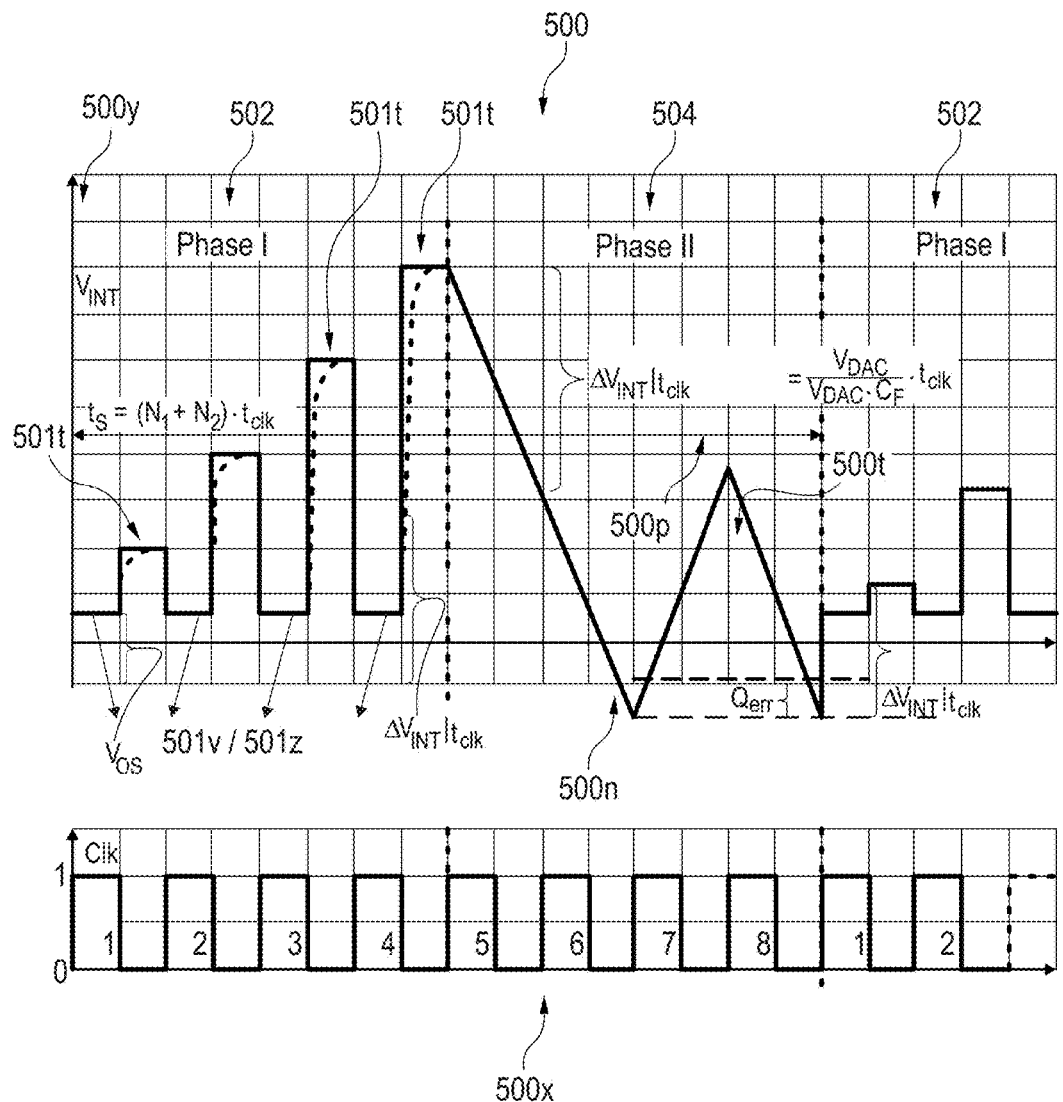
FIGS. 5B and 5C show an operating scheme of a multi-slope converter, according to various embodiments.
Figure 5C:
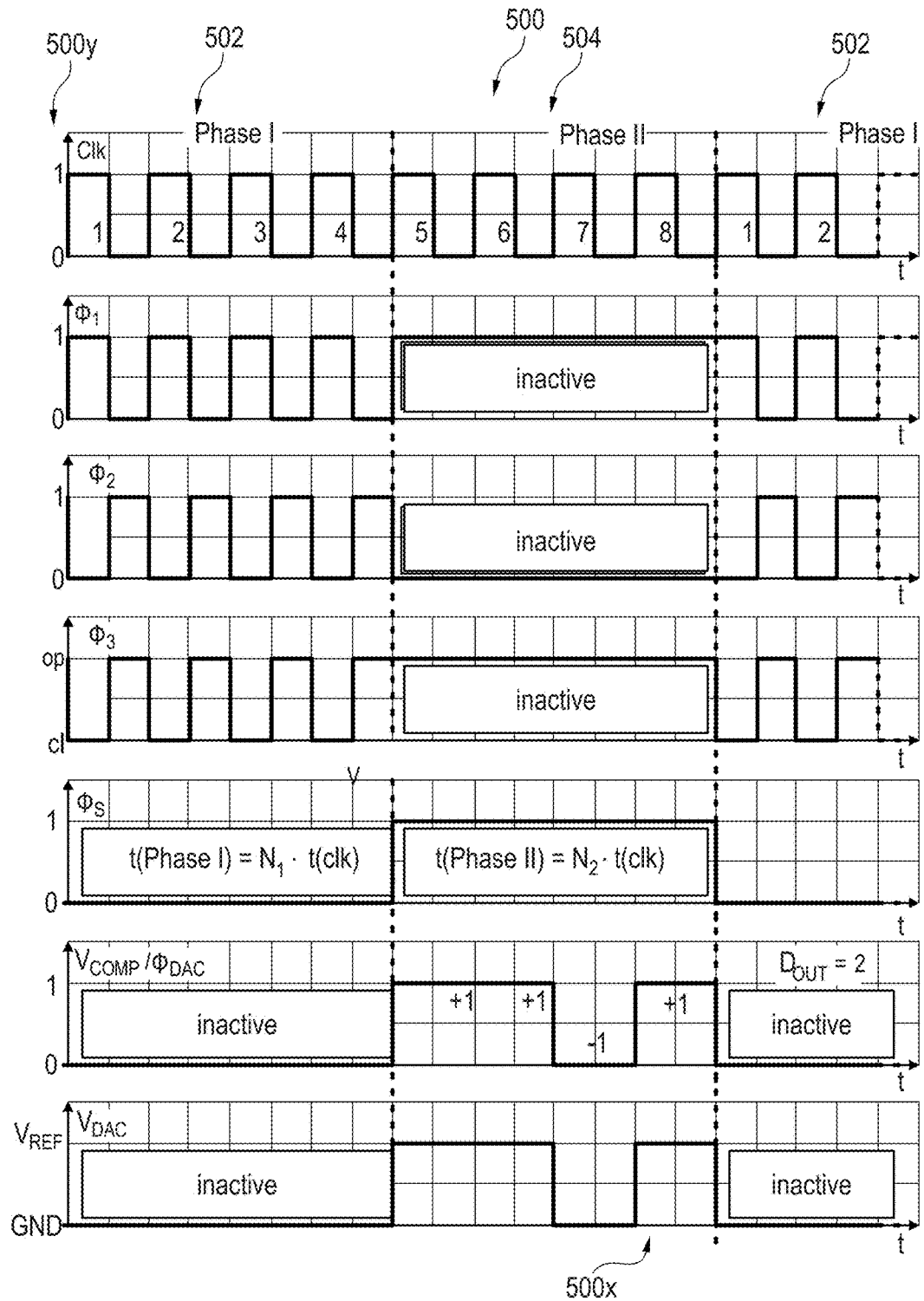

To pre-charge the two capacitors or to operate the multi-slope converter 100, the respective capacitors 206r, 206m of the capacitor arrangement 106k can be connected to different reference potentials (e.g. $V_{ref-1}$, $V_{ref-2}$ and ground potential) by means of at least two switches 106c (see also switch state $\Phi_1$ and switch state $\Phi_2$ in conjunction with FIG. 5C). The node 206k can be used to output a difference voltage or a difference charge on the integrator circuit 102, for example. This allows an improved resolution for changes of capacitance in the measurement capacitor 206m. The measurement capacitor 206m may be formed by means of a MEMS structure.

It goes without saying that the sensor circuit 106 can be modified as appropriate, e.g. it is possible for more than two capacitors to be used. By way of example, the capacitor arrangement 106k of the sensor circuit 106 may be set up as a half-bridge or full-bridge circuit (e.g. with two measurement capacitors 206m and reference capacitors 206r each).

Figure 3A:
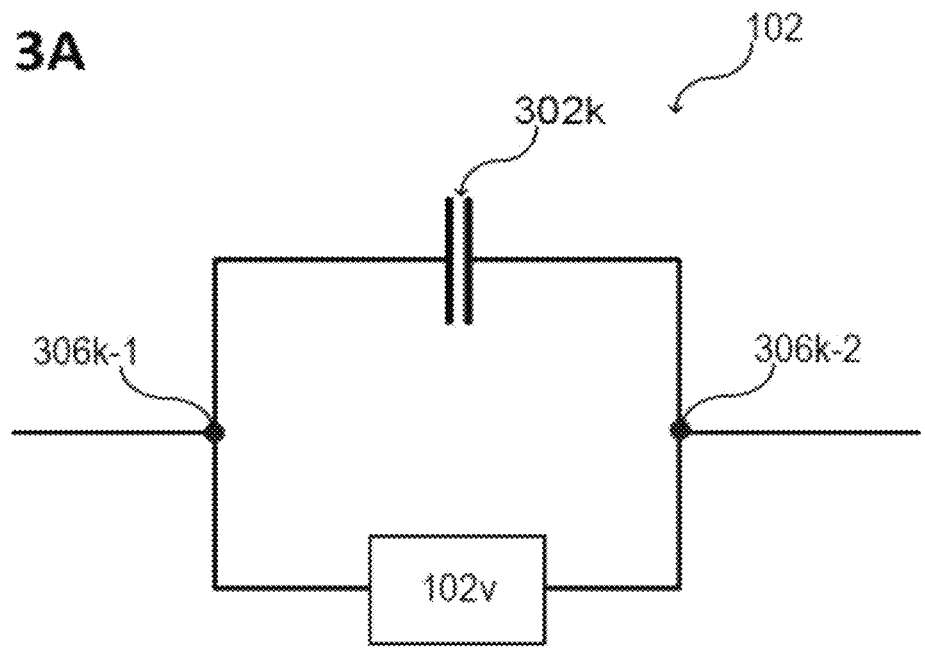
FIGS. 3A and 3B respectively show an integrator circuit of a multi-slope converter in a schematic depiction, according to various embodiments.

FIG. 3A illustrates, by way of example, an integrator circuit 102 in a schematic circuit diagram, according to various embodiments. In this case, the integrator circuit 102 can have at least one capacitor 302k as charge store 102s. The at least one capacitor may have the amplifier 102v of the integrator circuit 102 connected in parallel with it.

Figure 4A:
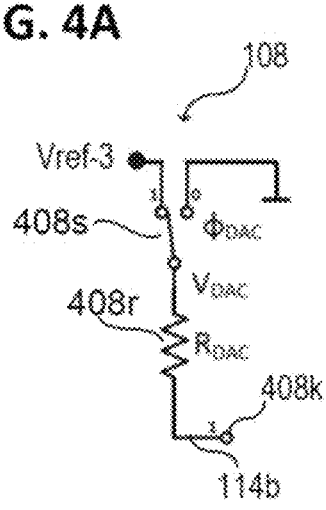
FIGS. 4A and 4B respectively show a discharging circuit of a multi-slope converter in a schematic depiction, according to various embodiments.
Figure 4B:
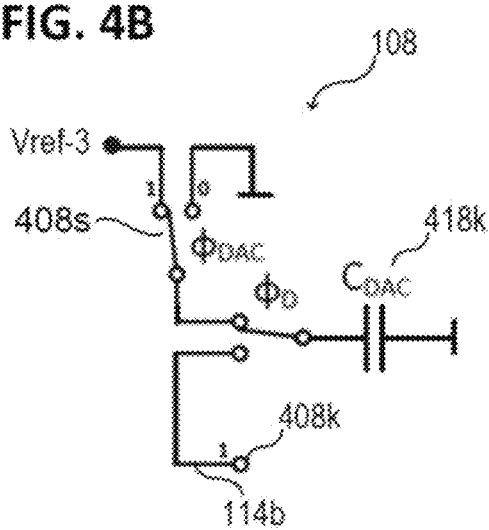

A first node 306k-1 can be used to connect the integrator circuit 102 either to the sensor circuit 106 (e.g. to the node 206k of the sensor circuit 106, as depicted in FIG. 2) or to the discharging circuit 108 (e.g. to the node 408k of the discharging circuit 108, as depicted in FIG. 4A or 4B). Further, the integrator circuit 102 may have been or can be connected to the comparator 104 by means of a second node 306k 2.

Figure 3B:
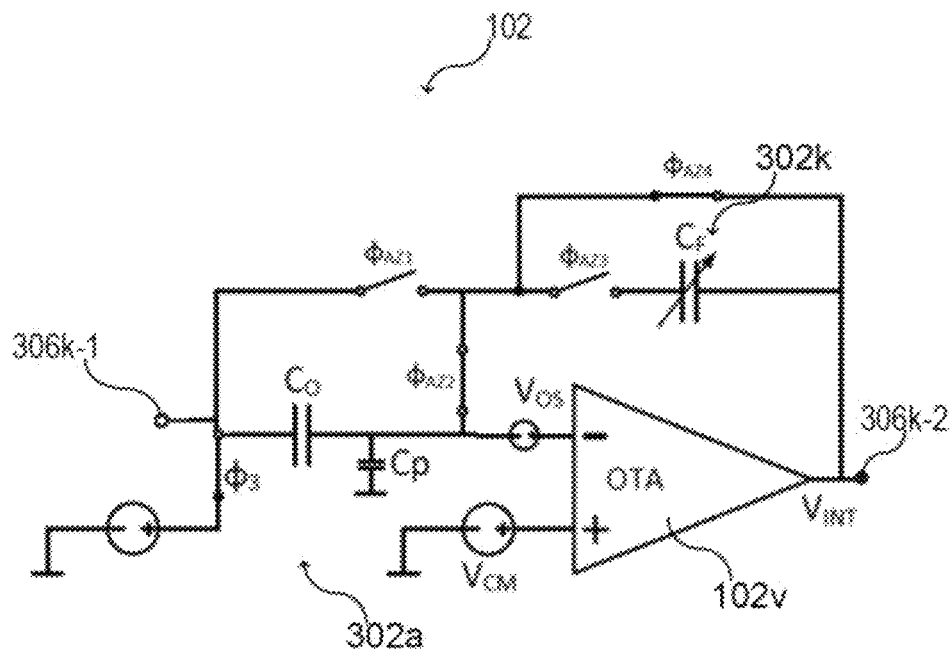

FIG. 3B illustrates, by way of example, an integrator circuit 102 in a schematic circuit diagram, wherein the integrator circuit 102 has an operational amplifier 102v (OTA), according to various embodiments.

The amplifier 102v may be set up as an auto-zero amplifier, for example, as depicted by way of example in FIG. 3B. In this regard, the integrator circuit 102 can have an auto-zero circuit 302a, e.g. having a capacitor (reference sign $C_0$). The auto-zero circuit 302a is controlled by means of a switch or by means of multiple switches, for example. The one or more switches may be part of the switch arrangement 110 in this case and be actuated by means of the controller circuit 112, for example (see also switch state $\Phi_3$ in conjunction with FIG. 5C and also the switch states $\Phi_{AZ1}$ to $\Phi_{AZ4}$ of the auto-zero control).

According to various embodiments, the controller circuit 112 (see FIG. 1B) may be set up to actuate the switch arrangement 110 such that in an auto-zero cycle an equivalent input offset voltage (see reference sign $V_{OS}$) of the amplifier 102v is compensated for. In this case, the controller circuit 112 may be set up to actuate the switch arrangement 110 such that the amplifier 102v is connected as a voltage follower during the auto-zero cycle.

According to various embodiments, an analog output voltage, $V_{INT}$, is output at the second node 306k-2 of the integrator circuit 102 (see FIG. 5B).

FIG. 4A illustrates, by way of example, a discharging circuit 108a in a schematic circuit diagram, according to various embodiments. The discharging circuit 108 can have a resistive device 408r (reference sign $R_{DAC}$), for example. To discharge the charge store 102s of the integrator circuit 102 continuously over time, the resistive device 408r can be connected to different reference potentials (e.g. $V_{ref-3}$ and/or ground potential) by means of at least one switch 408s (see also switch state $\Phi_{DAC}$ in conjunction with FIG. 5C).

FIG. 4B illustrates, by way of example, a discharging circuit 108 in a schematic circuit diagram, according to various embodiments. The discharging circuit 108 can have a capacitive device 418k (reference sign $C_{DAC}$), for example. To discharge the charge store 102s of the individual circuit 102 at discrete times, the capacitive device 418k can be connected to different reference potentials (e.g. $V_{ref-3}$ and/or ground potential) by means of a switch 408s or multiple switches (see also switch state $\Phi_{DAC}$ in conjunction with FIG. 5c and switch state $\Phi_D$).

The controlled (e.g. continuous time or discrete time) discharging of the charge store 102S of the integrator circuit 102 can be used to ascertain the charge integrated by the sensor circuit 106 by means of the integrator circuit 102, so that at the same time the capacitance of the measurement capacitor of the sensor circuit 106 or the relative capacitance of the capacitor measurement bridge can be ascertained therefrom. The length of time for discharging is digitized based on the clock signal 112t and represents the charge integrated by the sensor circuit 106 by means of the integrator circuit 102, or the measured capacitance of the sensor circuit 106, for example. In the same way, it is also possible for a different measured variable from a different suitable sensor circuit to be ascertained, e.g. an electrical resistance of a resistance measurement circuit or the like.

FIG. 5A illustrates, by way of example, a multi-slope converter 100 in a schematic circuit diagram, according to various embodiments. In this case, FIG. 5B and FIG. 5C illustrate the operating principle with an example of switch control on the basis of a timing diagram 500. The multi-slope converter 100 has, by way of example, an integrator circuit 102, a comparator 104, a sensor circuit 106, a resistive discharging circuit 108, a switch arrangement 110 and a controller circuit 112, as described by way of example above.

In this case, the controller circuit 112 is set up to provide the clock signal (reference sign Clk) for clocked operation of the comparator 104, for example. According to various embodiments, the controller circuit 112 is set up to generate a digital output signal 112d (e.g. by means of summation of the comparator output signal, $V_{COMP}$), that represents a capacitance of the capacitor arrangement 106k. The digital output signal 112d represents the number of clock cycles that were needed for discharging the charge store 102s of the integrator circuit 102, for example, this number of clock cycles needed for discharge scaling with the integrated charge and therefore with the ascertainable capacitance of the sensor circuit 106. Further, the controller circuit 112 is set up to provide control signals for actuating the switch arrangement 110, for example for setting the switch states $\Phi_{AZ1-AZ4}$, $\Phi_{DAC}$ and $\Phi_{1-3}$.

According to various embodiments, the reference voltages, $V_{REF}$, depicted in FIG. 5A may all be the same or different than one another. Furthermore, instead of a ground potential, it is also possible for another suitable reference potential to have been or to be provided.

Although the multi-slope converter 100 is described or depicted herein as a single-ended half-bridge circuit, it may be configured as a differential full-bridge circuit in an analogous manner.

As described herein, the quantization error (reference sign $Q_{err}$) of the respective preceding measurement is stored for the next measurement, e.g. in the feedback capacitor (reference sign $C_F$) of the integrator circuit 102. The feedback capacitor $C_F$ may be the charge store 102s of the integrator circuit 102. Therefore, improved performance can be achieved or a shorter required measurement time can be realized.

In FIG. 5B, one axis 500y depicts the output 102a ($V_{INT}$) of the integrator circuit 102 in correlation with the clock signal, Clk, on the other axis 500x, for example. In this case, the integration cycle 502 (also referred to as phase I) and the subsequent deintegration cycle 504 (also referred to as phase II) are depicted. The two cycles are executed alternately.

In FIG. 5C, one axis 500y depicts the switching states of the switch arrangement 110 or the control signals of the controller circuit 112 and also the digital comparator output signal 104d ($V_{COMP}$) and the profile of the reference voltage $V_{REF}$ or $V_{DAC}$ in correlation with the clock signal, Clk, on the other axis 500x, for example.

In this example, the integration cycle 502 is four clock cycles long and the deintegration cycle 504 is likewise four clock cycles long. The integrator circuit 102 was discharged after two clock cycles in this example (ascertained from the zero crossing or when the "least significant bit" was reached). Therefore, the controller circuit 112 outputs the digital output signal 112d ($D_{OUT}$) with the value 2.

As illustrated in FIG. 5B, the output from the integrator circuit 102 ($V_{INT}$) can also be further alternated (in other words toggled) 500t after the zero crossing 500n in phase II. The error charge remains stored in the charge store 112s of the integrator circuit 102 up until the subsequent phase I, however. A pass through phase I and phase II (i.e. an integration cycle 502 plus a subsequent deintegration cycle 504) can also be referred to as a sampling period 500p. For illustrative purposes, the quantization error from a sampling period remains stored for the immediately subsequent next sampling period. The length of time, $t_S$, for the sampling period is obtained from the first number of clock cycles, $N_1$, in phase I and from the second number of clock cycles, $N_2$, in phase II and the corresponding clock time, $t_{clk}$, or clock frequency, $1/t_{clk}$.

According to various embodiments, in phase I (i.e. in a first time period) the capacitor arrangement 106k of the sensor circuit 106 can be pre-charged (reference sign 501v), e.g. when Clk=1, and a charge can be transferred from the pre-charged capacitor arrangement 106k to the charge store 102s of the integrator circuit 102 (reference sign 501t), e.g. when Clk=0.

At the same time, during phase I, for example, it is also possible for the offset voltage (reference sign $V_{OS}$) of the amplifier 102v to be compensated for by means of the auto-zero circuit (reference sign 501z), e.g. when Clk=0.

According to various embodiments, in phase II (i.e. in the second time period alternately with the first time period), the charge store 102s of the integrator circuit 102 can be discharged by means of the discharging circuit 108. The discharging can be effected only during a third number of clock cycles (in this example, the charge store 102s is discharged within two clock cycles). In this case, the discharging can be effected with at most the second number of clock cycles, $N_2$, namely at most over the whole length of phase II (full range).

In phase II, the digital comparator output signal 104d and the digital output signal 112d of the controller circuit 112 can be generated based on the analog output signal 102a ($V_{INT}$) of the integrator circuit 102.

According to various embodiments, phase I can have a predefined first number of clock cycles $N_1$ and phase II can have a predefined second number of clock cycles $N_2$. In other words, the sampling period can remain constant. In this case, the multi-slope converter 100 may be set up such that these two parameters $N_1$ and $N_2$ can be adapted. Therefore, for illustrative purposes, the integration time and the deintegration time can be adapted in a simple manner as appropriate in order to allow the most optimum possible reading (for sensor circuits 106 having different properties, for example).

FIG. 5B depicts the discharging as discharging continuously over time. In an analogous manner, discharging can be effected at discrete times (for illustrative purposes gradually), as described herein (for example see FIG. 4B and FIGS. 6A to 6D). In the case of discharging at discrete times, it is also optionally possible for the offset voltage (reference sign $V_{OS}$) of the amplifier 102v to be compensated for by means of the auto-zero circuit at the same time during phase II, for example, e.g. when Clk=0 (not depicted).

According to various embodiments, the multi-slope converter 100 may be set up such that the zero crossing soon (see FIG. 5B) in the output signal 102a of the integrator circuit 102 is intrinsically resolved by means of the operation of the integrator circuit 102, as a result of which the complexity of the digital actuation and comparator precision is reduced, which saves power and chip area, for example.

As illustrated in the timing diagram of the reading chain in FIG. 5C, the signal QS defines phase I (also referred to as "sampling/integration phase") and phase II (also referred to as "feedback/deintegration phase") for the switch 110s at the switch arrangement 110.

In phase I ($\Phi_S$=0 or low), the integrator circuit 102 samples the capacitance difference between the measurement capacitor $C_2$ and the reference capacitor $C_1$ using the circuit control $\Phi_1$, $\Phi_2$ and $\Phi_3$. Additionally, the amplifier offset and the low-frequency noise are rejected by means of automatic zeroing (auto-zeroing).

In phase II ($\Phi_S=1$ or high), the input of the integrator circuit 102 is connected to the discharging circuit (e.g. to what is known as a feedback DAC) and $V_{INT}$ is discharged, e.g. continuously over time.

FIG. 5B depicts the sampling with an ideally gradual rise, i.e. with a response from the amplifier 102v having an infinite bandwidth, whereas the dashed line depicted is a more realistic rise, e.g. for a finite bandwidth of the amplifier.

According to various embodiments, an improved topology is provided at the ASIC level, e.g. a small and economical topology. Consequently, a smaller package can be provided. Further, this topology can also be integrated onto a chip with a further circuit, e.g. as a combination.

Further, the multi-slope converter 100 can allow adjustable performance, where resolution vs. measurement efficiency can be set. The clock based conversion provided by the ADC may be useful for technologies with a low operating voltage.

The dual-slope conversion described herein allows what is known as first order noise shaping. This reduces the measurement time required, for example.

FIG. 6A to FIG. 6D respectively illustrates a multi-slope converter 100 in a schematic circuit diagram at different times during operation, according to various embodiments. The multi-slope converter 100 has, by way of example, an integrator circuit 102, a comparator 104, a sensor circuit 106, a capacitive discharging circuit 108, a switch arrangement 110 and a controller circuit 112, as described by way of example above, see FIG. 5A in conjunction with FIG. 4B.

Figure 6B:
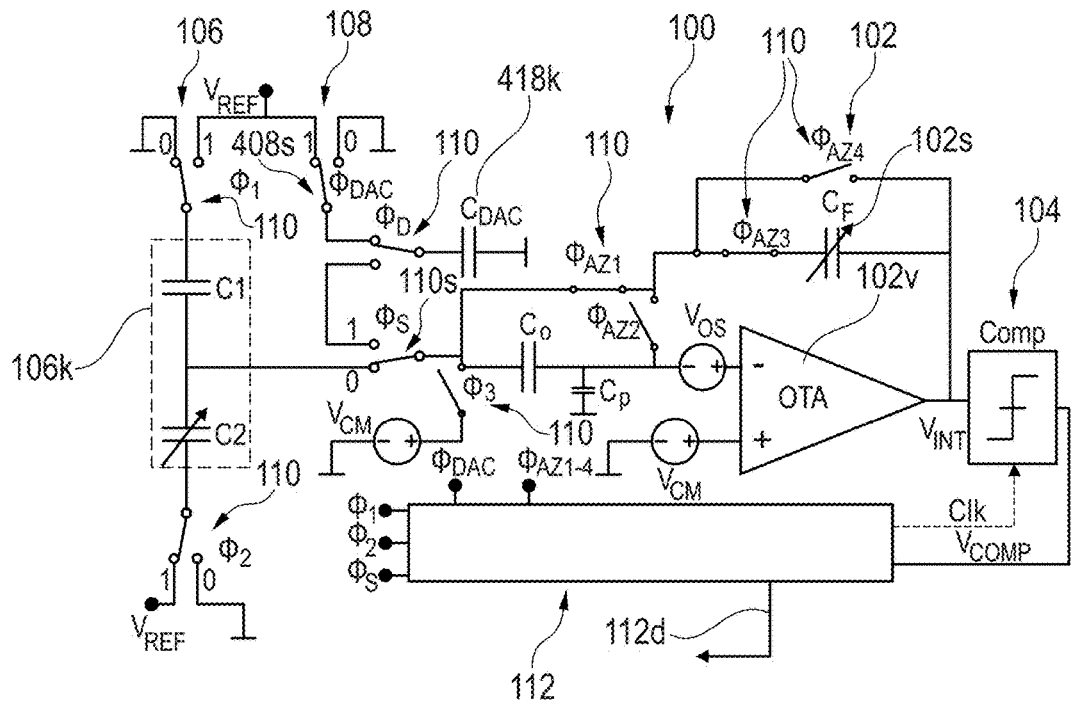
Figure 6C:
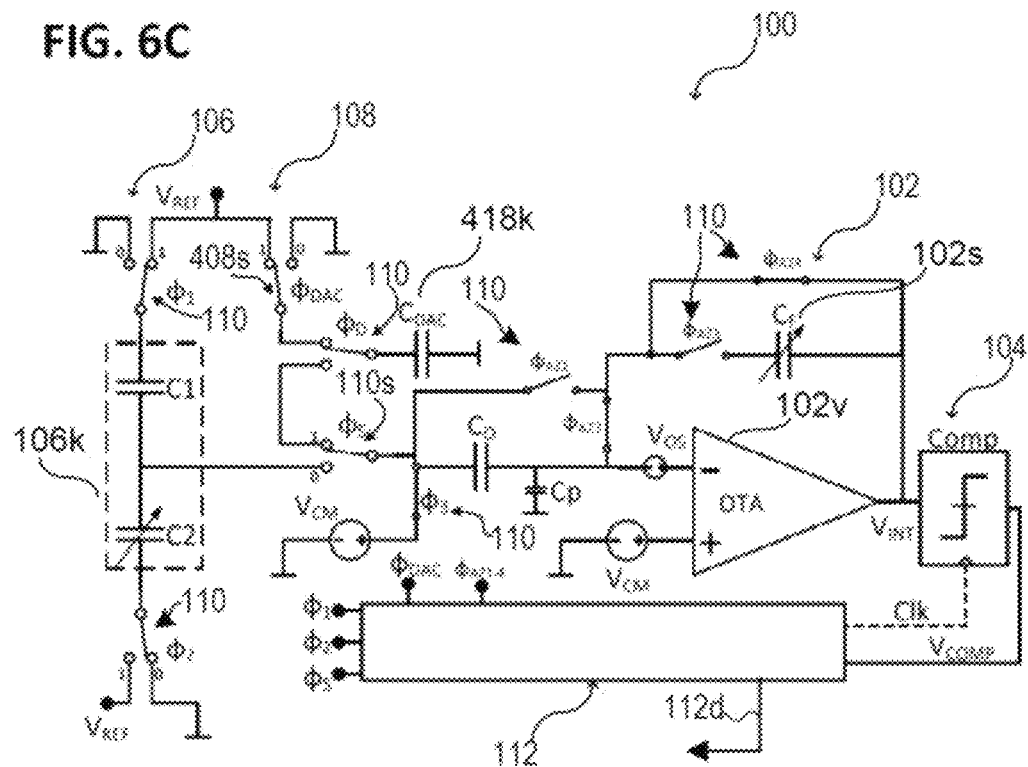
Figure 6D:
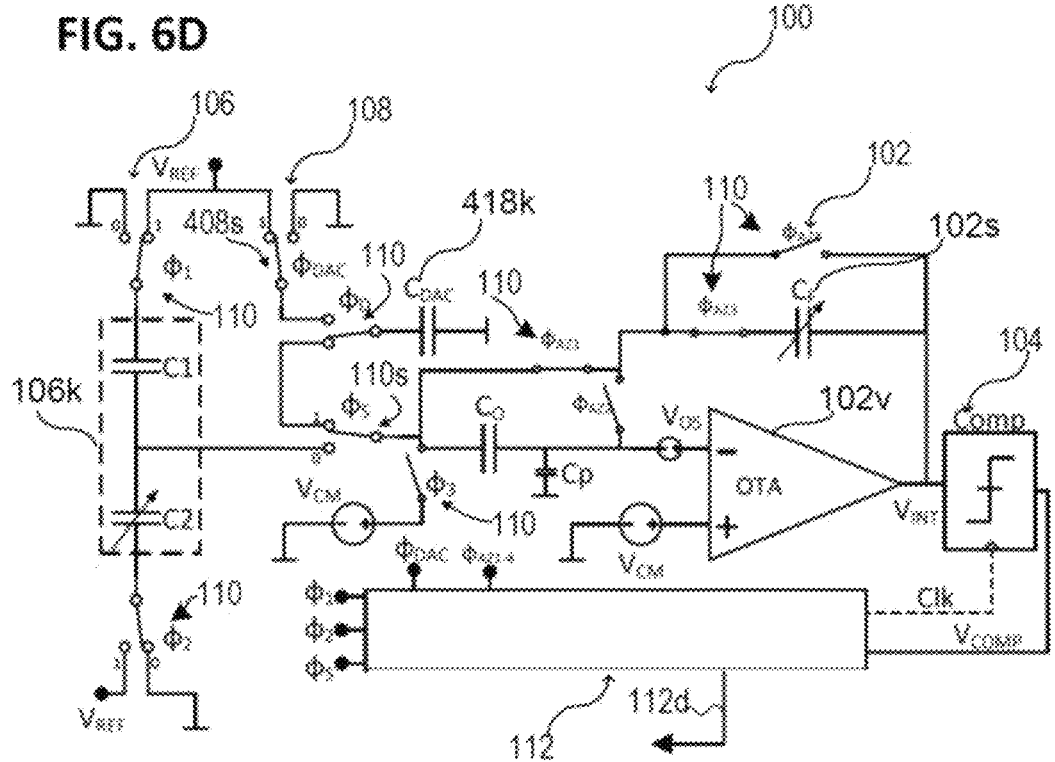

In this case, FIG. 6A shows the multi-slope converter 100 during phase I. In this case, the switch arrangement 110 is actuated such that the capacitor arrangement 106k of the sensor circuit 106 is pre-charged and that the offset voltage ($V_{OS}$) of the amplifier 102v is compensated for. FIG. 6B shows the multi-slope converter 100 during phase I, the switch arrangement 110 being actuated such that the charge of the pre-charged capacitor arrangement 106k is redistributed to the charge store 102s of the integrator circuit 102. FIG. 6C shows the multi-slope converter 100 during phase II, the switch arrangement 110 being actuated such that the capacitive device 418k ($C_{DAC}$) of the discharging circuit 108 is pre-charged and that the offset voltage ($V_{OS}$) of the amplifier 102v is compensated for. FIG. 6D shows the multi-slope converter 100 during phase II, the switch arrangement 110 being actuated such that the charge of the pre-charged capacitive device 418 ($C_{DAC}$) of the discharging circuit 108 is redistributed.

As described above, e.g. in regard to FIG. 5A to FIG. 5C and FIG. 6A to FIG. 6D, each conversion cycle (also referred to as sampling period 500p) can begin with the capacitor arrangement 106k, e.g. in the form of a capacitive MEMS bridge, being pre-charged.

During this pre-charging of the capacitor arrangement 106k, a first switch of the switch arrangement 110 is in position 1 (see switching state $\Phi_1=1$), a second switch of the switch arrangement 110 is in position 0 (see switching state $\Phi_2=0$), while a third switch of the switch arrangement 110 is closed (see switching state $\Phi_3$). Therefore, the capacitors of the capacitor arrangement 106k are respectively pre-charged between the potentials $V_{REF}$ and $V_{CM}$, or GND and $V_{CM}$, when the clock signal is at 1 or high, for example. At the same time, the amplifier 102v can be put into a unity gain feedback configuration (by means of multiple switches of the switch arrangement 110—see switching states $\Phi_{AZ1}$ to $\Phi_{AZ4}$) in order to compensate for the amplifier offset and/or in order to put low-frequency noise onto the capacitor ($C_0$) used for compensating for the amplifier offset.

As soon as the clock signal changes to 0 or low, the switches of the switch arrangement 110 alter the switching state therefore (see switching states $\Phi_1$ to $_3$ and $\Phi_{AZ1}$ to $\Phi_{AZ4}$). In this case, the position of the switches $\Phi_{AZ1}$ to $\Phi_{AZ4}$ needs to be taken into consideration.

Therefore, only the inverter input of the amplifier 102v can be connected in series with the capacitor ($C_0$) used for compensating for the amplifier offset and with the bridge output of the capacitor arrangement. Therefore, the charge of the capacitor arrangement 106k can be redistributed to the feedback capacitor 302k while the previously sampled offset is subtracted from the output of the integrator circuit 102 ($V_{INT}$).

The change in the output voltage ($V_{INT}$) of the integrator circuit 102 would be obtained according to the following equation (1), for example, for an ideal stage:

$$\Delta V_{INT}|_{t_{eib}\phi T} = \frac{C_1 - C_2}{C_F} \cdot V_{REF} \tag{1}$$

This change occurs whenever the clock signal toggles from 1 to 0 or from high to low, as illustrated in FIG. 5B, for example. Depending on the capacitance difference of the two capacitors of the capacitor measurement bridge 106k, this change occurs in the positive or negative direction. If there is no capacitance difference, the output voltage 102a ($V_{INT}$) of the integrator circuit 102 does not change and it remains at the sampled offset voltage ($V_{OS}$).

In the case of the example depicted in FIG. 5B, $C_1$ is assumed to be greater than $C_2$, so that the output voltage ($V_{INT}$) of the integrator circuit 102 increases.

The redistribution of the charge is repeated for the first number of clock cycles, $N_1$, during phase I. Assuming the capacitances of the capacitor measurement bridge 106k remain constant during phase I, an integrated voltage of:

$$V_{out_{final\phi I}} = \Delta V_{INT} \cdot N1 = \frac{C_1 - C_2}{C_F} \cdot V_{REF} \cdot N1 \tag{2}$$

is ideally obtained.

This integrated voltage represents the measured capacitance ($C_2$) of the sensor circuit 106, provided that the remaining capacitances (e.g. $C_F$) and the voltage $V_{REF}$ and the number of clock cycles $N_1$ are known. The purpose of phase II is therefore to evaluate this integrated voltage and convert it into a digital signal.

During phase I, the switch 110s of the switch arrangement 110 (see FIG. 5A, FIG. 6A and FIG. 6B) is in position 0 ($\Phi_S=0$). As soon as the switch 110s is put into position 1 ($\Phi_S=1$) (see FIG. 6C and FIG. 6D), phase II begins, in which the discharging circuit 108 is connected to the amplifier 102v. At the same time, the first switch of the switch arrangement 11o is put into position 1 (see switching state $\Phi_1=1$) and the second switch of the switch arrangement 110 is put into position 0 (see switching state $\Phi_2=0$), the third switch of the switch arrangement 110 remaining open (see switching state $\Phi_3$), however. In this case, the subtracted offset voltage remains unaltered in comparison with the last sampled offset voltage from phase I.

In phase II, the clocked comparator 104 is evaluated on every rising or falling edge of the clock signal. The digital-output signal 104d ($V_{COMP}$) thereof is used, e.g. evaluated by means of the controller circuit 112, to generate the multi-bit digital output signal 112d, for example. In this case, the comparator 104 itself may be a single-bit comparator 104. Further, the digital-output signal 104d ($V_{COMP}$) of the comparator 104 can be used to control the discharging circuit 108, e.g. to switch a switch 408s of the discharging circuit 108 (see switching state $\Phi_{DAC}$).

To generate the digital output signal 112d of the controller circuit 112, a simple counter can be used that sums the digital output signal 104d ($V_{COMP}$) of the comparator 104 for a sampling period 500p only during phase II, wherein a high level (1) of the digital output signal 104d ($V_{COMP}$) of the comparator 104 adds a 1 and a low level (0) of the digital output signal 104d ($V_{COMP}$) of the comparator 104 adds a -1, or subtracts a -1 (see FIG. 5C).

Therefore, the digital output signal 112d of the controller circuit 112 (Dour) is proportional to the magnitude of the capacitance difference of the capacitor measurement bridge 106k of the sensor circuit 106.

When the polarity of the digital output signal 104d ($V_{COMP}$) of the comparator 104 changes (for illustrative purposes when the zero crossing 500n is detected), the switch arrangement 110 is controlled such that the error charge in the feedback capacitor 302k of the integrator circuit 102 is maintained. By way of example, the discharge voltage ($V_{DAC}$) is toggled between $V_{REF}$ and GND by virtue of the switch 408s of the discharging circuit 108 being switched to and fro according to the clock signal (Clk) up to the end of phase II (see FIG. 5C).

The temporal resolution of the multi-slope converter 100 is obtained, by way of example, from the total length of time of a sampling period 500p and the length of time of a clock cycle of the clock signal, or in other words from the clock frequency divided by the total number of clock cycles ($N_1+N_2$) of a sampling period 500p.

Figure 7:
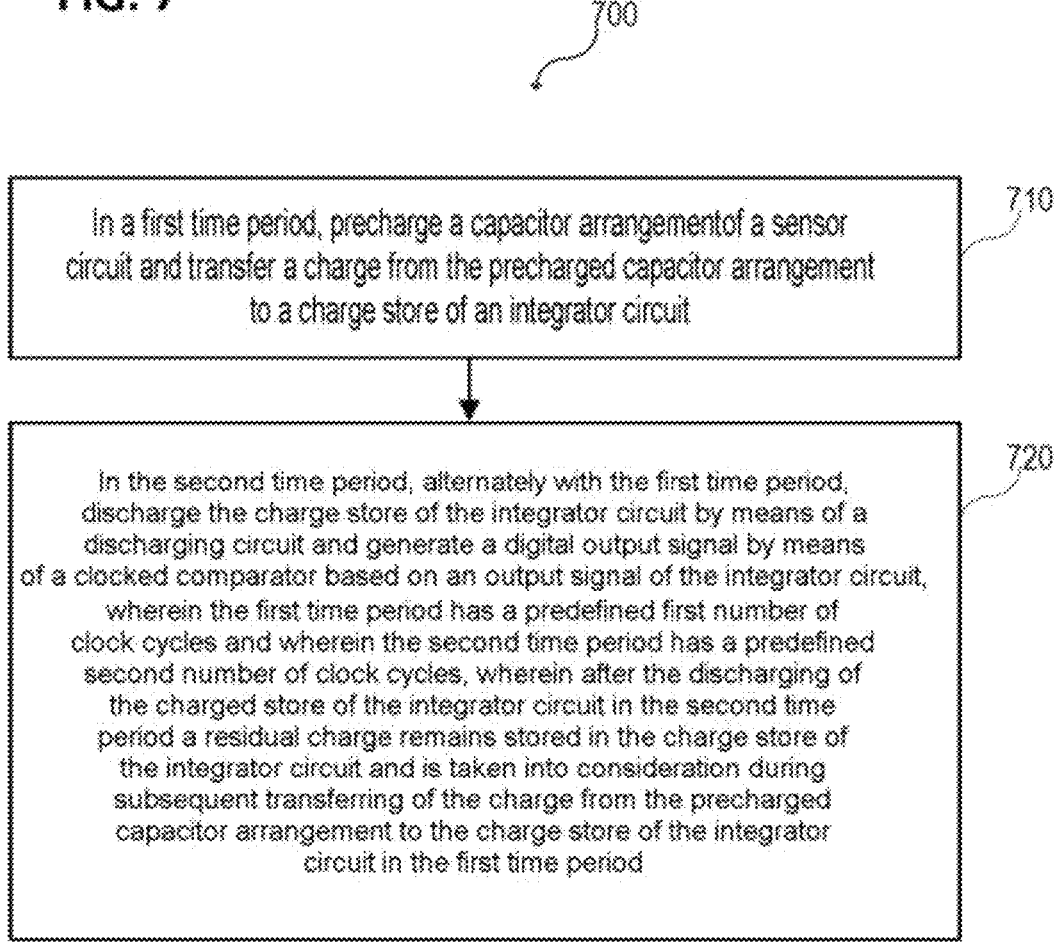
FIG. 7 shows a schematic flowchart for a method for converting a capacitance into a digital signal, according to various embodiments.

FIG. 7 illustrates a schematic flowchart for a method 700 for converting a capacitance into a digital signal, according to various embodiments. In this case, the method 700 can involve the following, for example: in 710, in a first time period (for example see phase I in FIG. 5B), pre-charging a capacitor arrangement 106k of a sensor circuit 106 and transferring a charge from the pre-charged capacitor arrangement 106k to a charge store 102s of an integrator circuit 102; and, in 720, in a second time period (for example see phase II in FIG. 5B), alternately with the first time period, discharging the charge store 102s of the integrator circuit 102 by means of a discharging circuit 108 and generating a digital output signal 104d, 112d (e.g. $V_{COMP}$ or $D_{OUT}$) by means of a clocked comparator 104 based on an analogous output signal 102a ($V_{INT}$) of the integrator circuit 102. In this case, the first time period has a predefined first number of clock cycles ($N_1$) and the second time period has a predefined second number of clock cycles ($N_2$), wherein after the discharging of the charge store 102s of the integrator circuit 102 in the second time period a residual charge ($Q_{err}$) remains stored in the charge store 102s of the integrator circuit 102 and is taken into consideration during subsequent transfer of the charge from the pre-charged capacitor arrangement 106k to the charge store 102s of the integrator circuit 102 in the first time period.

According to various embodiments, the multi-slope converter 100 may be set up to be freely configurable in terms of the numbers of clock cycles ($N_1$ and/or $N_2$), so that it can be easily adapted to suit a sensor circuit 106 or to suit a measurement accuracy or measurement speed to be achieved.

To convert the capacitance of the sensor circuit 106 in a first mode of operation, it is possible for a first tuple ($N_1$, $N_2$) to be used, for example, and to convert the capacitance of the sensor circuit 106 in a second mode of operation, it is possible for a second tuple ($N_1$, $N_2$), which is different than the first tuple, to be used, for example. In this case, the ratio of $N_1$ to $N_2$ can be altered with the same sum and/or the ratio of $N_1$ to $N_2$ can remain the same, only the sum of $N_1$ and $N_2$ being altered, or both, it being possible for both the sum of $N_1$ and $N_2$ and the ratio of $N_1$ to $N_2$ to be altered.

Therefore, it is possible for a resolution characteristic (e.g. a maximum resolution and/or a resolution accuracy) of the multi-slope converter 100 to be adapted, for example.

Various examples relating to what is described above and/or to what is depicted in the figures are described below.

Example 1 is a multi-slope converter 100 having: an integrator circuit 102 having a charge store 102s; a clocked comparator 104; a sensor circuit 106 having a capacitor arrangement 106k and a charging circuit 106c for pre-charging the capacitor arrangement 106k, a discharging circuit 108; a switch arrangement 110 and a controller circuit 112 for actuating the switch arrangement 110 based on a clock signal, wherein the controller circuit 112 is set up to actuate the switch arrangement 110 such that, alternately: in an integration cycle electrical charge is transferred from the capacitor arrangement 106k of the sensor circuit 106 to the charge store 102s of the integrator circuit 102, and in a deintegration cycle the charge store 102s of the integrator circuit 102 is discharged by means of the discharging circuit 108, wherein after the deintegration cycle a residual charge remains stored in the charge store 102s of the integrator circuit 102 and is taken into consideration during a subsequent integration cycle.

In example 2, the multi-slope converter 100 according to example 1 can optionally involve, by way of example, the integrator circuit 102 further having an amplifier 102v. The amplifier may be an operational amplifier (OTA), for example.

In example 3, the multi-slope converter 100 according to example 2 can optionally involve the amplifier 102v being connected between the capacitor arrangement 106k of the sensor circuit 106 and the clocked comparator 104 in the integration cycle, and the amplifier 102v being connected between the discharging circuit 108 and the clocked comparator 104 in the deintegration cycle.

In example 4, the multi-slope converter 100 according to example 2 or 3 can optionally involve the amplifier 102v being set up as an auto-zero amplifier. In other words, the integrator circuit 102 can have an auto-zero circuit 302a.

In example 5, the multi-slope converter 100 according to example 4 can optionally involve the controller circuit 112 being set up to actuate the switch arrangement 110 such that in an auto-zero cycle an equivalent input offset voltage (see reference sign $V_{OS}$) of the amplifier 102v is compensated for.

In example 6, the multi-slope converter 100 according to example 5 can optionally involve the controller circuit 112 being set up to actuate the switch arrangement 110 such that the amplifier 102v is connected as a voltage follower during the auto-zero cycle.

The auto-zero cycle can be used to compensate for an amplifier offset, for example.

In example 7, the multi-slope converter 100 according to one of examples 1 to 6 can optionally involve the clocked comparator 104 being coupled to the integrator circuit 102 to compare an analog output signal 102a ($V_{INT}$) of the integrator circuit 102 with a comparator reference signal 104*r* (e.g. with ground potential, GND, or with a reference potential) and to output a digital comparator output signal 104*d* ($V_{COMP}$) based on the comparison.

In example 8, the multi-slope converter 100 according to example 7 can optionally involve the controller circuit 112 further being set up to output a digital output signal 112*d* ($D_{OUT}$) based on the comparator output signal 104*d* ($V_{COMP}$), wherein the digital output signal 112*d* (Dour) output by the controller circuit 112 represents a capacitance of the capacitor arrangement 106*k*.

In example 9, the multi-slope converter 100 according to one of examples 1 to 8 can optionally involve its being set up such that the capacitor arrangement 106*k* can be connected to the integrator circuit 102 in a first branch 114*a* to transfer a charge from the pre-charged capacitor arrangement 106*k* to the charge store 102*s* of the integrator circuit 102, and that the discharging circuit 108 can be connected to the integrator circuit 102 in a second branch 114*b* to discharge the charge store 102*s* of the integrator circuit 102.

In example 10, the multi-slope converter 100 according to example 9 can optionally involve the switch arrangement 110 having a switch 110*s* that connects either the first branch 114*a* or the second branch 114*b* to the integrator circuit 102.

In example 11, the multi-slope converter 100 according to one of examples 1 to 10 can optionally involve the discharging circuit 108 having a resistive device 408*r* or a current source to discharge the charge store 102*s* of the integrator circuit 102 continuously over time.

In example 12, the multi-slope converter 100 according to one of examples 1 to 10 can optionally involve the discharging circuit 108 having a capacitive device 418*k* to discharge the charge store 102*s* of the integrator circuit 102 at discrete times.

In example 13, the multi-slope converter 100 according to one of examples 1 to 12 can optionally involve the capacitor arrangement 106*k* of the sensor circuit 106 having at least one measurement capacitor 206*m* and at least one reference capacitor 206*r*.

In example 14, the multi-slope converter 100 according to one of examples 1 to 13 can optionally involve the clocked comparator 104 being a single-bit comparator.

In example 15, the multi-slope converter 100 according to one of examples 1 to 14 can optionally involve the capacitor arrangement 106*k* of the sensor circuit 106 being set up as a half-bridge or full-bridge circuit.

In example 16, the multi-slope converter 100 according to one of examples 1 to 15 can optionally involve the integrator circuit 102 and/or the clocked comparator 104 being set up in unbalanced (also referred to as non-differential, or signal-ended) or balanced (also referred to as differential) fashion.

Example 17 is a method 700 for converting a capacitance into a digital signal, the method involving: in a first time period (phase I or integration cycle), pre-charging a capacitor arrangement 106*k* of a sensor circuit 106 and transferring a charge from the pre-charged capacitor arrangement 106*k* to a charge store 102*s* of an integrator circuit 102; and in a second time period (phase II or deintegration cycle), alternately with the first time period, discharging the charge store 102*s* of the integrator circuit 102 by means of a discharging circuit 108 and generating a digital output signal by means of a clocked comparator 104 based on an output signal ($V_{INT}$) of the integrator circuit 102, wherein the first time period has a predefined first number of clock cycles ($N_1$) and wherein the second time period has a predefined second number of clock cycles ($N_2$), wherein after the discharging of the charge store 102*s* of the integrator circuit 102 in the second time period a residual charge ($Q_{err}$) remains stored in the charge store 102*s* of the integrator circuit 102 and is taken into consideration during subsequent transfer of the charge from the pre-charged capacitor arrangement 106*k* to the charge store 102*s* of the integrator circuit 102 in the (e.g. subsequent) first time period.

In example 18, method 700 according to example 17 can optionally involve the discharging of the charge store 102*s* of the integrator circuit 102 in the second time period being effected during a third number of clock cycles ($N_3$), the third number of clock cycles ($N_3$) being less than or no more than equal to the second number of clock cycles ($N_2$). For illustrative purposes, the third number of clock cycles ($N_3$) may be the discharge time of the charge store 102*s* of the integrator circuit 102 up to the first zero crossing.

In example 19, method 700 according to example 17 or 18 can optionally further involve: compensating for an (equivalent) input offset voltage of an amplifier 102*v* of the integrator circuit 102.

In example 20, method 700 according to one of examples 17 to 19 can optionally further involve: setting the first number of clock cycles ($N_1$) and/or the second number of clock cycles ($N_2$) to convert the capacitance in a first mode of operation and in a second mode of operation, which is different than the first mode of operation.

In example 21, method 700 according to example 20 can optionally involve the conversion of the capacitance being affected with a first resolution characteristic in the first mode of operation and with a second resolution characteristic in the second mode of operation, the two resolution characteristics being different than one another. By way of example, the measurement frequency (sampling rate), the measurement interval (range), the measurement accuracy, etc. can be understood as a resolution characteristic.

In example 22, a self-oscillating multi-slope converter 100 is used to directly read a capacitance of a sensor arrangement 106 by means of capacitor switch control.

What is claimed is:

1. A multi-slope converter comprising:
   an integrator circuit having a charge store;
   a clocked comparator;
   a sensor circuit having a capacitor arrangement and a charging circuit for pre-charging the capacitor arrangement,
   a discharging circuit; and
   a switch arrangement and a controller circuit for actuating the switch arrangement based on a clock signal, wherein the controller circuit is configured to actuate the switch arrangement such that, alternately:
     in an integration cycle electric charge is transferred from the capacitor arrangement of the sensor circuit to the charge store of the integrator circuit, and
     in a deintegration cycle, the charge store of the integrator circuit is discharged by the discharging circuit, wherein after the deintegration cycle a residual charge remains stored in the charge store of the integrator circuit and is taken into consideration during a subsequent integration cycle.

2. The multi-slope converter as claimed in claim 1, wherein the integrator circuit further comprises an amplifier, wherein the amplifier is an operational amplifier.

3. The multi-slope converter as claimed in claim 2,
   wherein the amplifier is connected between the capacitor arrangement of the sensor circuit and the clocked comparator in the integration cycle, and
   wherein the amplifier is connected between the discharging circuit and the clocked comparator in the deintegration cycle.

4. The multi-slope converter as claimed in claim 2, wherein the amplifier is configured as an auto-zero amplifier.

5. The multi-slope converter as claimed in claim 1, wherein the clocked comparator is coupled to the integrator circuit to compare an output signal of the integrator circuit with a comparator reference signal and to output a digital comparator output signal based on the comparison.

6. The multi-slope converter as claimed in claim 5, wherein the controller circuit is further configured to output a digital output signal based on the digital comparator output signal, wherein the digital output signal output by the controller circuit represents a capacitance of the capacitor arrangement.

7. The multi-slope converter as claimed in claim 1,
wherein the capacitor arrangement is connectable to the integrator circuit in a first branch to transfer a charge from the pre-charged capacitor arrangement to the charge store of the integrator circuit, and
wherein the discharging circuit is connectable to the integrator circuit in a second branch to discharge the charge store of the integrator circuit.

8. The multi-slope converter as claimed in claim 7, wherein the switch arrangement comprises at least one switch that connects either the first branch or the second branch to the integrator circuit.

9. The multi-slope converter as claimed in claim 1,
wherein the discharging circuit comprises a resistive device or a current source to discharge the charge store of the integrator circuit continuously over time, or
wherein the discharging circuit comprises a capacitive device to discharge the charge store of the integrator circuit at discrete times.

10. The multi-slope converter as claimed in claim 1, wherein the capacitor arrangement of the sensor circuit comprises at least one measurement capacitor and at least one reference capacitor.

11. The multi-slope converter as claimed in claim 1, wherein the clocked comparator is a single-bit comparator.

12. The multi-slope converter as claimed in claim 1, wherein the capacitor arrangement of the sensor circuit is configured as a half-bridge circuit or a full-bridge circuit.

13. A method for converting a capacitance into a digital signal, the method comprising:
in a first time period, pre-charging a capacitor arrangement of a sensor circuit and transferring a charge from the pre-charged capacitor arrangement to a charge store of an integrator circuit; and
in a second time period, alternately with the first time period, discharging the charge store of the integrator circuit using a discharging circuit and generating a digital output signal using of a clocked comparator based on an output signal of the integrator circuit,
wherein the first time period has a predefined first number of clock cycles and wherein the second time period has a predefined second number of clock cycles, wherein after the discharging of the charge store of the integrator circuit in the second time period a residual charge remains stored in the charge store of the integrator circuit and is taken into consideration during subsequent transferring of the charge from the pre-charged capacitor arrangement to the charge store of the integrator circuit in the first time period.

14. The method as claimed in claim 13, wherein the discharging of the charge store of the integrator circuit during the second time period is effected with a third number of clock cycles, the third number of clock cycles being less than the second number of clock cycles.

15. The method as claimed in claim 13, further comprising compensating for an input offset voltage of an amplifier of the integrator circuit.

16. The method as claimed in claim 13, further comprising setting the first number of clock cycles and/or the second number of clock cycles to convert the capacitance in a first mode of operation and in a second mode of operation, which is different than the first mode of operation.

* * * * *